(12) United States Patent
Kim et al.

(10) Patent No.: US 9,665,058 B2
(45) Date of Patent: May 30, 2017

(54) IMAGE FORMING APPARATUS AND CHIP

(71) Applicant: SAMSUNG ELECTRONICS CO., LTD., Suwon-si, Gyeonggi-do (KR)

(72) Inventors: Youn-jae Kim, Yongin-si (KR); Seung-hun Park, Suwon-si (KR); Seob Cho, Yongin-si (KR)

(73) Assignee: S-PRINTING SOLUTION CO., LTD., Suwon-si (KR)

( * ) Notice: Subject to any disclaimer, the term of this patent is extended or adjusted under 35 U.S.C. 154(b) by 328 days.

(21) Appl. No.: 14/103,077

(22) Filed: Dec. 11, 2013

(65) Prior Publication Data
US 2015/0023684 A1  Jan. 22, 2015

(30) Foreign Application Priority Data

Jul. 19, 2013 (KR) .................. 10-2013-0085191

(51) Int. Cl.
*H01R 9/00* (2006.01)
*G03G 15/00* (2006.01)
(Continued)

(52) U.S. Cl.
CPC ....... *G03G 15/80* (2013.01); *H01L 23/49816* (2013.01); *H01L 23/49838* (2013.01);
(Continued)

(58) Field of Classification Search
CPC ............... H01L 23/50; H01L 23/49836; H01L 2924/01078–2924/01079; H05K 1/111–1/115; H05K 3/429; H05K 3/3436
(Continued)

(56) References Cited

U.S. PATENT DOCUMENTS 5,729,894 A   3/1998   Rostoker et al.
5,894,410 A   4/1999   Barrow
(Continued)

FOREIGN PATENT DOCUMENTS

EP   1460690      9/2004
JP   2001-160602  6/2001
(Continued)

OTHER PUBLICATIONS

Extended European Search Report dated Apr. 14, 2014 from European Patent Application No. 14151186.5 (seven pages).
(Continued)

*Primary Examiner* — Tuan T Dinh
(74) *Attorney, Agent, or Firm* — Staas & Halsey LLP

(57) ABSTRACT

An image forming apparatus includes a board which controls an image forming job processor and an image former which performs an image forming job according to a control by the board. The board may include a plurality of power connectors for providing power, a plurality of first signal connectors continuously disposed such that they are spaced apart by a first distance in an exterior angle of the power connectors, a plurality of second signal connectors disposed such that each of them is spaced apart from one another by two or more times the first distance in an exterior angle of the first signal connectors, and a chip including a plurality of third signal connectors continuously disposed such that they are spaced apart by the first distance in an exterior angle of the second signal connectors.

19 Claims, 20 Drawing Sheets

(51) Int. Cl.
*H01L 23/498* (2006.01)
*H01L 23/50* (2006.01)

(52) U.S. Cl.
CPC .... *H01L 23/50* (2013.01); *H01L 2224/16225* (2013.01); *H01L 2924/15311* (2013.01)

(58) Field of Classification Search
USPC .......................... 361/767–775; 174/259–264
See application file for complete search history.

(56) References Cited

U.S. PATENT DOCUMENTS

| | | | |
|---|---|---|---|
| 6,285,560 | B1 | 9/2001 | Lyne |
| 6,689,634 | B1 | 2/2004 | Lyne |
| 7,259,336 | B2* | 8/2007 | Wyrzykowska ....... H05K 1/112 174/250 |
| 2004/0227233 | A1 | 11/2004 | Hussa |
| 2008/0064138 | A1 | 3/2008 | Barrow |
| 2009/0045508 | A1 | 2/2009 | Romero |
| 2009/0174072 | A1 | 7/2009 | Coates |
| 2012/0052628 | A1* | 3/2012 | Kuroda .................. H01L 24/32 438/107 |

FOREIGN PATENT DOCUMENTS

| | | |
|---|---|---|
| JP | 2008-252152 | 10/2008 |
| KR | 10-2006-0019541 | 3/2006 |
| KR | 10-2009-0017447 | 2/2009 |

OTHER PUBLICATIONS

Memjet: "Controller Chip", Jan. 28, 2013, XP002722702, Retrieved from the Internet: URL: Http://web.archive.org/web/20130128134417//http://memjet.com/technology/controller-chip , retrieved on Apr. 2, 2014, pp. 1-4.

M David Stone: "Memjet Office Printer", PCmag, Jun. 17, 2011, XP002722703, Retrieved from the Internet: URL: http://www.pcmag.com/article2/0,2817,238717,00.asp , retrieved on Apr. 2, 2014, 18 pages.

* cited by examiner

IMAGE FORMING APPARATUS AND CHIP

CROSS-REFERENCE TO RELATED APPLICATIONS

This application claims priority from Korean Patent Application No. 10-2013-0085191, filed in the Korean Intellectual Property Office on Jul. 19, 2013, the disclosure of which is incorporated herein by reference.

BACKGROUND

1. Field

Methods and apparatuses with respect to the exemplary embodiments disclosed herein relate to an image forming apparatus and chip, and more particularly, to an image forming apparatus and chip where a circuit board having a small number of layers may be used by changing the ball arrangement of a chip.

2. Description of the Related Art

An image forming apparatus generally refers to an apparatus configured to (suitable for, capable of, adapted to, etc.) print data on a printing medium (for example, printing paper), the print data being generated in a terminal such as a computer. A copier, printer, facsimile, and multi function peripheral (MFP) which combines two or more functions of a copier, printer, and facsimile in one apparatus are examples of an image forming apparatus.

Recent image forming apparatuses provide high-speed printing functions, or use systems on chip (SoC) in order to process various images. Herein, SoC may refer to a technology and product where various semiconductor components are integrated in one component.

In the case of using an SoC, the SoC is mounted on a surface of a printed circuit board (PCB) for use in an image forming apparatus. Herein, in the circuit board, a pattern may be formed to electrically connect the SoC with other devices, but since it is impossible to electrically connect all SoC with other devices using one layer, vias, that is, a plurality of layers, are used to form a pattern for electrically connecting the SoC with other devices.

Meanwhile, there are various elements determining the number of layers to be provided in a circuit board, and the most important element is generally the SoC. That is, the SoC determines the number of layers of the circuit board. The smaller the number of devices connected to the SoC, the smaller the number of vias of the pattern for electrically connecting the SoC with the devices, and thus the size area of the routing is not limited so much, and only one or two routing layers are necessary. But, when there are numerous devices connected to the SoC, the number of patterns and vias increase, thereby increasing the routing area and the number of routing layers. Thus, there is required a multi-layer PCB where a pattern layer is embedded inside, instead of a single-sided or double-sided circuit board.

Theoretically, there is no limitation to the number of layers that may be deposited in a multi-layer PCB, but the greater the number of layers deposited in a multi-layer PCB, the greater the manufacturing cost, and thus considering the product applicability and the reality, it is not practical (or efficient) to simply increase the number of PCB layers. In this regard, there is required a method for using a circuit board having a small number of layers by changing the ball arrangement of a chip.

SUMMARY

Additional aspects and/or advantages will be set forth in part in the description which follows and, in part, will be apparent from the description, or may be learned by practice of the invention.

The disclosure provides an image forming apparatus and chip where a circuit board having a small number of layers may be used or obtained by changing a ball arrangement of the chip.

In one general aspect, there is provided an image forming apparatus comprising a board configured to (suitable for, capable of, adapted to, etc.) control an image forming job processor, and an image former configured to (suitable for, capable of, adapted to, etc.) perform an image forming job according to a control by the board. The board may include a plurality of power connectors for providing power, a plurality of first signal connectors continuously disposed such that they are spaced apart by a first distance in an exterior angle of the power connectors, a plurality of second signal connectors disposed such that each of them is spaced apart from one another by two or more times the first distance in an exterior angle of the first signal connectors, and a chip comprising a plurality of third signal connectors continuously disposed such that they are spaced apart by the first distance in an exterior angle of the second signal connectors.

In the general aspect of the image forming apparatus, the board may comprise a plurality of layers, and the plurality of first signal connectors and the plurality of second signal connectors may be connected to the image former through a pattern disposed in same layers or a same layer of the board.

In the general aspect of the image forming apparatus, the board may comprise a plurality of vias for connecting the plurality of first signal connectors and the plurality of second signal connectors.

In the general aspect of the image forming apparatus, the plurality of first signal connectors may be disposed in a plurality of columns continuously disposed and spaced apart by the predetermined first distance.

In the general aspect of the image forming apparatus, the number of the columns of the plurality of first signal connectors may be one more than the number of patterns that may be disposed between the predetermined first distance.

In the general aspect of the image forming apparatus, the plurality of second signal connectors may be disposed in a line direction each spaced apart from one another by two or more times the predetermined first distance, and may be continuously disposed in a column direction in a plurality of columns each spaced apart from one another by the predetermined first distance.

In the general aspect of the image forming apparatus, the plurality of third signal connectors may be disposed in a plurality of columns continuously disposed and spaced apart from one another by the predetermined first distance.

In the general aspect of the image forming apparatus, the plurality of third signal connectors may be connected to the image former through a pattern disposed on a surface of the board to which the plurality of third signal connectors are physically connected.

In the general aspect of the image forming apparatus, the plurality of power connectors may be disposed in m columns (m being a natural number) and n lines (n being a natural number) each spaced apart from one another by the predetermined first distance.

In the general aspect of the image forming apparatus, the plurality of power connectors and the plurality of first signal connectors may be spaced apart by a predetermined second distance from each other.

In the general aspect of the image forming apparatus, the chip may further comprise a plurality of fourth signal connectors disposed such that each of them is spaced apart from one another by two or more times the first distance in an exterior angle of the third signal connectors.

In the general aspect of the image forming apparatus, the board may comprise a plurality of layers, and the plurality of third signal connectors and the plurality of fourth signal connectors may be connected to the image former through a pattern disposed in a same layer or same layers of the board.

In another general aspect, there is provided a chip for an image forming apparatus, the chip comprising a control logic unit, a plurality of power connectors for supplying power to the control logic unit, and a plurality of signal connectors configured to (suitable for, capable of, adapted to, etc.) transceive signals between the control logic unit and an external circuit board, and each spaced apart from one another by a predetermined first distance. The plurality of signal connectors may include a plurality of first signal connectors continuously disposed such that they are spaced apart from one another by the first distance in an exterior angle of the power connectors, a plurality of second signal connectors disposed such that they are spaced apart from one another by two or more times the first distance in an exterior angle of the first signal connectors, and a plurality of third signal connectors continuously disposed such that they are spaced apart from one another by the first distance in an exterior angle of the second signal connectors.

In the general aspect of the chip for an image forming apparatus, the plurality of first signal connectors may be disposed in a plurality of columns continuously disposed and spaced apart from one another by the predetermined first distance.

In the general aspect of the chip for an image forming apparatus, the number of the columns of the plurality of first signal connectors may be one more than the number of patterns that may be disposed between the predetermined first distance.

In the general aspect of the chip for an image forming apparatus, the plurality of second signal connectors may be disposed in a line direction each spaced apart from one another by two or more times the predetermined first distance, and may be continuously disposed in a column direction in a plurality of columns each spaced apart from one another by the predetermined first distance.

In the general aspect of the chip for an image forming apparatus, the plurality of third signal connectors may be disposed in a plurality of columns continuously disposed and spaced apart from one another by the predetermined first distance.

In the general aspect of the chip for an image forming apparatus, the plurality of power connectors may be disposed in m columns (m being a natural number) and n lines (n being a natural number) each spaced apart from one another by the predetermined first distance.

In the general aspect of the chip for an image forming apparatus, the plurality of power connectors and the plurality of first signal connectors may be spaced by a predetermined second distance from each other.

In the general aspect of the chip for an image forming apparatus, the chip may further comprise a plurality of fourth signal connectors disposed such that each of them is spaced apart from one another by two or more times the first distance in an exterior angle of the third signal connectors.

In another general aspect, there is provided a chip including a control logic unit, an array of power connectors, disposed at a central location of the chip, to supply power to the control logic unit, and a plurality of signal connectors, disposed externally about the array of power connectors, to transceive signals between the control logic unit and a circuit board. The plurality of signal connectors may include first signal connectors spaced apart from the power connectors by a first distance, the first signal connectors being arranged such that the first signal connectors are separated from one another in a first direction by a second distance, second signal connectors disposed externally about the first signal connectors, the second signal connectors being arranged such that the second signal connectors are separated from one another in the first direction by a multiple (greater than one) of the second distance, and third signal connectors disposed externally about the second signal connectors, the third signal connectors being arranged such that the third signal connectors are separated from one another in the first direction by the second distance.

The first signal connectors may include at least two columns disposed externally about the array of power connectors, including a first column disposed externally about the second column, the first column of first signal connectors being separated from the second column of first signal connectors by the second distance in a second direction.

The second signal connectors may include at least two columns disposed externally about the first signal connectors, including a first column disposed externally about the second column, the first column of second signal connectors being separated from the second column of second signal connectors by the second distance in a second direction.

The third signal connectors may include at least two columns disposed externally about the second signal connectors, including a first column disposed externally about the second column, the first column of third signal connectors being separated from the second column of third signal connectors by the second distance in a second direction.

The array of power connectors and the plurality of signal connectors may be electrically connected to a printed circuit board, the printed circuit board including a plurality of layers. The third signal connectors may be patterned through a first layer among the plurality of layers, the power connectors may be patterned through a ground layer and a power layer among the plurality of layers, and the first signal connectors and second signal connectors may be patterned through a second layer among the plurality of layers.

The signal connectors may further include fourth signal connectors disposed externally about the third signal connectors, the fourth signal connectors being arranged such that the fourth signal connectors are separated from one another in the first direction by a multiple (greater than one) of the second distance. The fourth signal connectors may be patterned through the first layer among the plurality of layers.

The second layer may be buried such that the first signal connectors and second signal connectors are patterned through to the second layer through vias, whereas the third signal connectors may be patterned through to the first layer without using a via.

BRIEF DESCRIPTION OF THE DRAWINGS

The above and/or other aspects of the present disclosure will be more apparent by describing certain present disclosure with reference to the accompanying drawings, in which.

DETAILED DESCRIPTION

Figure 1:
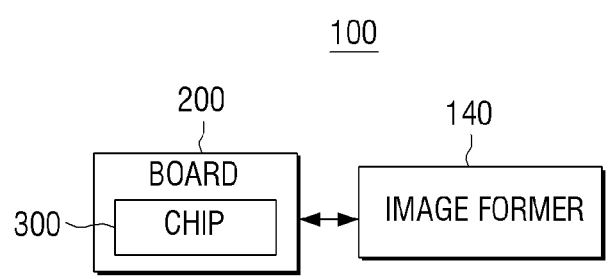
FIG. 1 is a schematic block diagram of an image forming apparatus according to an exemplary embodiment of the present disclosure.

Certain exemplary embodiments are described in higher detail below with reference to the accompanying drawings.

In the following description, like drawing reference numerals are used for like elements, even in different drawings. The matters defined in the description, such as detailed construction and elements, are provided to assist in a comprehensive understanding of exemplary embodiments. However, exemplary embodiments can be practiced without those specifically defined matters. Also, well-known functions or constructions are not described in detail since they would obscure the application with unnecessary detail.

FIG. 1 is a schematic block diagram of an image forming apparatus according to an exemplary embodiment of the present disclosure.

With reference to FIG. 1, an image forming apparatus 100 according to an exemplary embodiment of the present disclosure comprises a board 200 and an image former 140. Herein, the image forming apparatus 100 may include a copier, printer, facsimile, or a multi function peripheral (MFP) that combines two or more functions of a copier, printer, and facsimile. The image forming apparatus may include a 3D image forming apparatus.

The image former 140 performs an image forming job. More specifically, the image former 140 performs a series of operations of forming an image on a printing medium, which may include, for example, one or more sheets of paper such as glossy paper, plain paper, art paper, overhead projector film, and the like. The construction and operations of the image former 140 are generally the same as the construction and operations of an engine provided in a general image forming apparatus, and thus a specific explanation thereof is omitted.

The board 200 controls a job process related to forming an image. More specifically, the board 200 receives an image forming job from an external terminal (not illustrated), and controls various operations of the image former 140 to perform the image forming job.

In addition, the board 200 comprises a plurality of power connectors for supplying power, a plurality of first signal connectors continuously disposed and spaced apart by a predetermined first distance in an exterior angle of the power connectors, a plurality of second signal connectors disposed such that each of them is mutually spaced apart by twice or more of the first distance from one another in an exterior angle of the first signal connectors, and a chip 300 comprising a plurality of third signal connectors continuously disposed and spaced apart by the first distance in an exterior angle of the second signal connectors, and a pattern on a circuit board (that is, for example a PCB) for connecting the plurality of connectors of the chip to the image former 140. The specific arrangement of the board 200 will be explained hereinafter with reference to FIGS. 5 to 9, and specific functions of the chip 300 will be explained hereinafter with reference to FIGS. 3 and 4. Herein, the predetermined first distance refers to a distance between each pin when designing a circuit and a semiconductor chip, which may correspond to a distance according to a standard PCB design criteria.

Hereinabove, the image forming apparatus 100 was explained briefly, but the image forming apparatus 100 may further comprise other configurations besides the aforementioned configuration. A more detailed configuration of the image forming apparatus will be explained below with reference to FIG. 2. However, the disclosure is not limited to the example embodiments shown in FIG. 1 and FIG. 2, and other image forming apparatuses having different constitutions (e.g. having more or less features) may include the board and chip according to the example embodiments disclosed herein.

Figure 2:
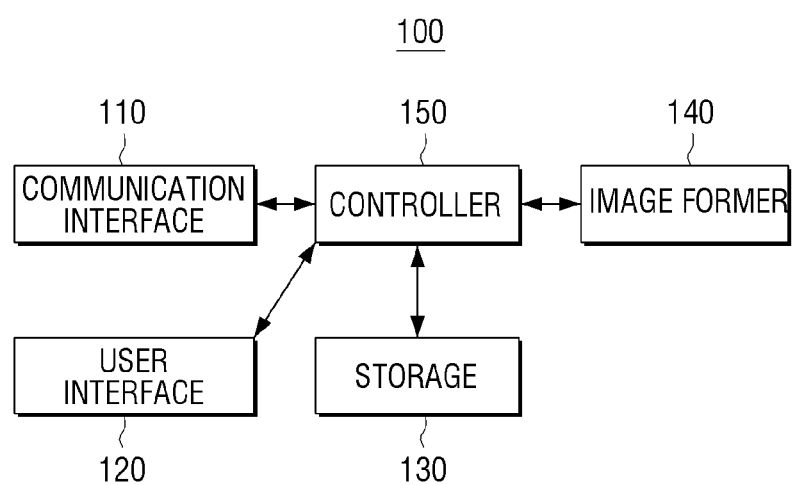
FIG. 2 is a specific diagram of an image forming apparatus according to an exemplary embodiment of the present disclosure.

FIG. 2 is a block diagram of an image forming apparatus according to an exemplary embodiment of the present disclosure.

With reference to FIG. 2, the image forming apparatus 100 may include a communication interface 110, user interface 120, storage 130, image former 140 and a controller 150.

The communication interface 110 may be formed to connect the image forming apparatus 100 to a print control terminal (not illustrated), and may have a format accessible through a universal serial bus (USB), a format accessible through a local area network (LAN), and the internet, for example. The communication interface 110 may connect to the terminal through a wired or wireless network, or a combination thereof.

In addition, the communication interface 110 may receive print data from a print control terminal (not illustrated). Herein, the print data may include data of a printer language such as, for example, a postscript (PS) and a printer control language (PCL), and when the image forming apparatus 100 supports direct printing, the print data may be the file itself such as a PDF, XPS, BMP, JPG, or text document (TXT). The print control terminal may include a PC, notebook PC, a PDA, a smartphone, a digital camera, a tablet, and the like.

The user interface 120 may be provided with various function keys with which a user may determine or select various functions that are provided by the image forming apparatus, and the user interface 120 may display various information provided by the image forming apparatus 100. The user interface 120 may include a monitor and mouse combined, or an apparatus that provides both inputting and outputting functions. Generally, the user interface may include, for example, one or more of a keyboard, a mouse, a joystick, a button, a switch, an electronic pen or stylus, an input sound device (e.g., a microphone to receive a voice command), an output sound device (e.g., a speaker), a track ball, a remote controller, a portable (e.g., a cellular or smart) phone, a tablet PC, a pedal or footswitch, a virtual-reality device, and so on. The user interface may further include a haptic device to provide haptic feedback to a user. The user interface may also include a touch screen, for example.

The storage 130 stores print data. More specifically, the storage 130 stores print data received through the communication interface 110. Such a storage 130 may be embodied as a storage medium or external storage medium inside the image forming apparatus 100, and may include for example, a removable disk including a USB, a web server through a network, and the like. In the present exemplary embodiment, storage 130 was illustrated and explained, but the storage 130 may be embodied as a memory for data storing or a memory for processing commands. For example, the storage may be embodied as a storage medium, such as a nonvolatile memory device, such as a Read Only Memory (ROM), Programmable Read Only Memory (PROM), Erasable Programmable Read Only Memory (EPROM), and flash memory, a USB drive, a volatile memory device such as a Random Access Memory (RAM), a hard disk, floppy disks, a blue-ray disk, or optical media such as CD ROM discs and DVDs, or combinations thereof. However, examples of the storage are not limited to the above description, and the storage may be realized by other various devices and structures as would be understood by those skilled in the art.

The image former 140 performs an image forming job. More specifically, the image former 140 may perform a series of operations to form an image on a printing medium using print data received through the communication interface 110.

The controller 150 controls various configurative elements inside the image forming apparatus. More specifically, when the controller 150 receives print data from a print control terminal (not illustrated), it may control the image former 140 so that the received print data is printed. The controller may include one or more processors for example.

As aforementioned, the communication interface 110, user interface 120, storage 130, and controller 150 may be disposed in the aforementioned board 200, and some functions of the controller 150 or some functions of the image former 140 may be performed using the board 200.

Figure 3:
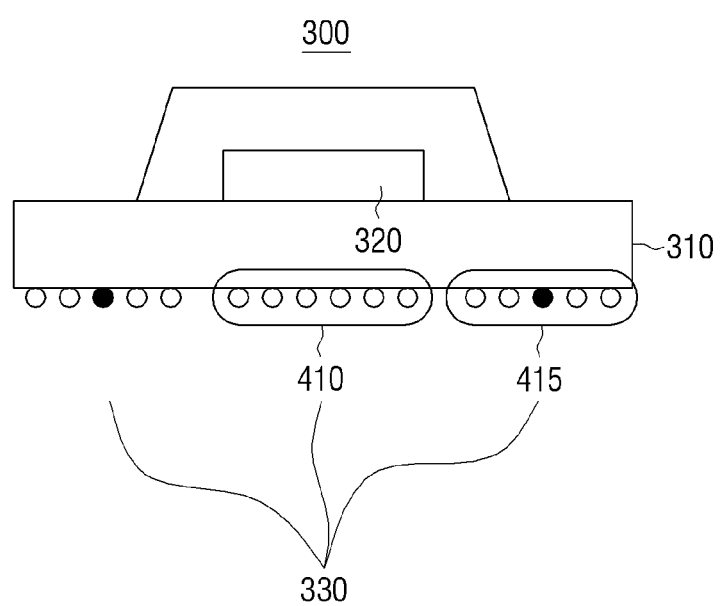
FIG. 3 is a cross-sectional view according to an exemplary embodiment of the present disclosure.
Figure 4:
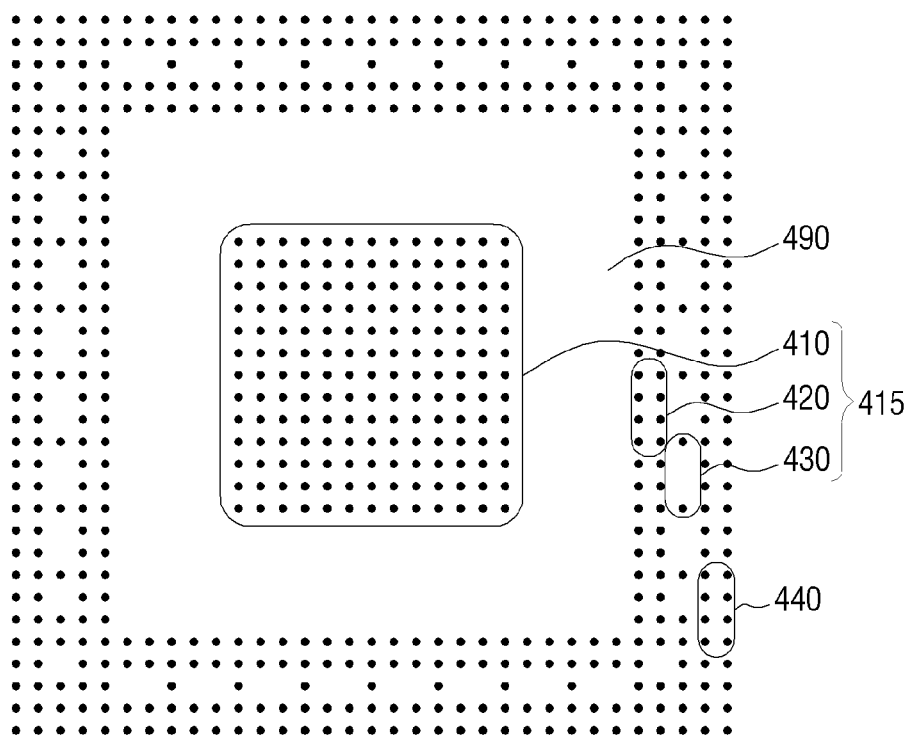
FIG. 4 is a plane view of a chip according to an exemplary embodiment of the present disclosure.

FIG. 3 is a cross-sectional view according to an exemplary embodiment of the present disclosure, and FIG. 4 is a top view of a chip according to an exemplary embodiment of the present disclosure.

With reference to FIGS. 3 and 4, the chip 300 according to an exemplary embodiment of the present disclosure comprises a board 310, control logic unit 320, and a plurality of connectors 330.

The control logic unit 320 may be mounted on the board 310. Specifically, the board 310 secures the control logic unit 320, and electrically connects the control logic unit 320 and the plurality of connectors 330. More specifically, the board 310 comprises a plurality of bonding fingers (not illustrated) disposed in a location corresponding to various pads of the control logic unit 320, a pattern (not illustrated) on the board 310, and a via hole (not illustrated), and may use the configuration to provide power and various signals to the control logic unit 320, and transmit signals generated in the control logic unit 320 to an external device (that is, for example, the PCB).

The control logic unit (320, or core) may include a plurality of pads (or pins). Herein, the control logic unit 320 may correspond to an integrated circuit chip such as a semiconductor memory circuit such as a RAM, ROM, flash memory etc., or an ASIC chip.

The plurality of connectors 330 may be physically/electrically connected to the board 200. Specifically, the plurality of connectors 330 are soldered with a plurality of terminals of the board 200, and may provide power provided from the board 200 to the control logic unit 320, or transceiver signals between the control logic unit 320 and devices on the board. Meanwhile, although the chip connected to the board 200 may be referred to as a connector, it may be referred to as a soldering, ball, terminal or pad, etc.

Such a plurality of connectors 330 may be distinguished from one another as a power connector 410 and a signal connector 415 according to its function.

The power connector 410 may include a ball supplying power to the control logic unit 320. Such a power connector 410 may include a ground connector configured to (or adapted to, capable of, operable to, suitable for, etc.) deliver a potential (that is, for example a ground potential) to the control logic unit 320, or a power connector configured to (or adapted to, capable of, operable to, suitable for, etc.) deliver a predetermined potential to the control logic unit 320. There may be two power connectors 410, but for stable power supply, there may be three or more power connectors as illustrated in FIG. 4 (for example, there are 169 power connectors 410 shown in FIG. 4). Herein, the plurality of power connectors may be disposed in a center of a chip 300 as illustrated in FIG. 4, and may be disposed in m columns and n lines or rows each spaced apart (for example, the plurality of power connectors may be spaced apart uniformly, by a predetermined first distance). Herein, m and n are natural numbers. The number of such power connectors 410 may be determined based on the amount of electricity needed in the chip 300.

The signal connectors 415 transceive signals between the control logic unit 320 and the board 200. Such a plurality of signal connectors 415 may be disposed in multiples of the mutually predetermined first distance, and the number of the signal connectors 415 may be determined based on the number of signals transceived to/from the chip 300.

In addition, the signal connectors 415 may be disposed by a predetermined distance 490 from the power connector 410. That is, with respect to the viewpoint shown in FIG. 4, the signal connectors 415 may be offset from an outer column of power connectors (i.e., the furthest left and right power connectors) in left and right directions by a predetermined distance 490. Likewise, with respect to the viewpoint shown in FIG. 4, the signal connectors 415 may be offset from an outer line or row of power connectors (i.e., the uppermost or lowest power connectors) in up and down directions by a predetermined distance 490 or by a different distance.

In addition, the signal connectors 415 may include a first signal connector 420, second signal connector 430, and third signal connector 440, according to the disposition format (or the location of the pattern on the board). Meanwhile, in the illustrated example, there are only three signal connectors, but more than three signal connectors may be provided. For example, a fourth signal connector may be further included. In some cases, a fifth and sixth signal connector, or more than six signal connectors may be further included. This is explained in further detail with reference to FIGS. 15 to 20 hereinbelow. As can be seen from FIG. 4, the signal connectors 415 and the power connectors 410 are shaped or formed similarly to concentric squares. That is, the power connectors 410 (with 13 by 13 power connectors) are concentric to the signal connectors 415, separated by a predetermined distance (e.g., predetermined distance 490, with the inner plurality of first signal connectors 420 having 25 signal connectors horizontally disposed and 25 signal connectors vertically disposed.

The plurality of first signal connectors 420 may be continuously disposed, spaced apart by a first distance in an exterior angle of the power connector 410. Specifically, the plurality of first signal connectors 420 are disposed in a location spaced apart by the predetermined first distance in an exterior angle of the power connector 410, each being separated by the first distance from one another.

Such a plurality of first signal connectors 420 may include a plurality of columns continuously disposed so that each of the connectors 420 are spaced apart from one another by the predetermined first distance as illustrated in FIG. 4. In this case, the maximum number of the columns may desirably be one more than the number of the patterns on the circuit board that may be disposed between the first distance.

For example, when a chip 300 is disposed on a circuit board where only one pattern may be formed between the first distance, the plurality of first signal connectors 420 may be disposed in two columns. On the other hand, when a chip 300 is disposed on a circuit board where two patterns may be formed between the first distance, the plurality of first signal connectors 420 may be disposed in three columns.

The plurality of second signal connectors 430 may be disposed such that each of them is mutually spaced apart by two or more times the first distance in an exterior angle of the first signal connector 420. Specifically, the plurality of second signal connectors 430 may be disposed such that they are spaced apart by the first distance in an exterior angle of the first signal connector 420 from the first signal connectors 420, and also disposed such that each of them is mutually spaced apart by twice the distance of the predetermined first distance from one another.

For example, the plurality of second signal connectors 420 may be disposed such that each of them is mutually spaced by two or three times the predetermined first distance from one another. However, when the plurality of second signal connectors 420 are mutually distanced by too large of a distance from one another, numerous connectors cannot be disposed on the chip, and thus it is desirable that the plurality of second signal connectors are spaced apart by six times or less of the mutually predetermined first distance.

The third signal connectors 440 may be continuously disposed such that they are spaced apart by the first distance in an exterior angle of the second signal connectors 430. Specifically, the plurality of third signal connectors 440 may be disposed such that they are spaced apart by the predetermined first distance in an exterior angle of the second signal connectors 430, and so that each of them is spaced apart by the first distance from one another. Such a plurality of third signal connectors 440 may have a plurality of columns continuously disposed such that they are spaced apart from one another by the predetermined first distance as illustrated in FIG. 4.

In this case, the maximum number of the columns may desirably be one more than the number of patterns on the circuit board that may be disposed between the first distance. For example, when the chip 300 is disposed on a circuit board where only one pattern may be formed between the first distance, the plurality of third signal connectors 440 may be disposed in two columns. On the other hand, when the chip 300 is disposed on a circuit board where two patterns may be formed between the first distance, the plurality of third signal connectors 440 may be disposed in three columns.

Hereinabove, the plurality of signal connectors 415 were illustrated in that they included first signal connectors to third signal connectors, but fourth signal connectors having the same format as the second signal connectors may be further disposed in an exterior angle of the third signal connectors. Various formats of the chip are explained hereinbelow with reference to FIGS. 15 to 20.

Meanwhile, in explaining FIGS. 3 and 4, it was illustrated that the chip 300 according to the example embodiment corresponded to a chip for exclusive use in the image forming apparatus, but there is no limitation to the chip in the present exemplary embodiment, and thus any chip (or SoC) where a plurality of balls must be disposed may be applied to the present disclosure regardless of its functions.

Figure 5:
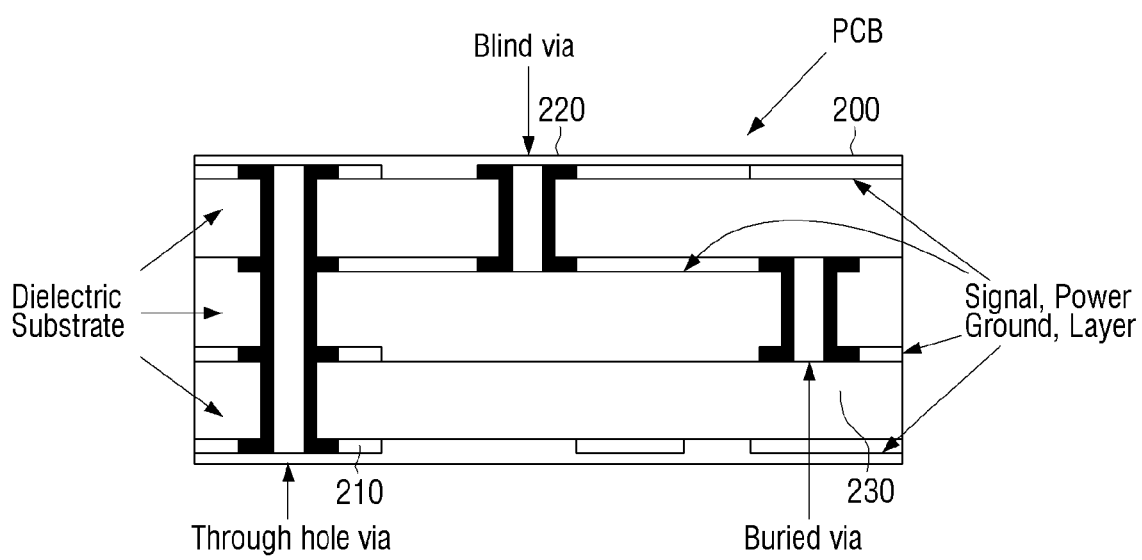
FIGS. 5 and 6 are plane views of a board according to an exemplary embodiment of the present disclosure.
Figure 6:
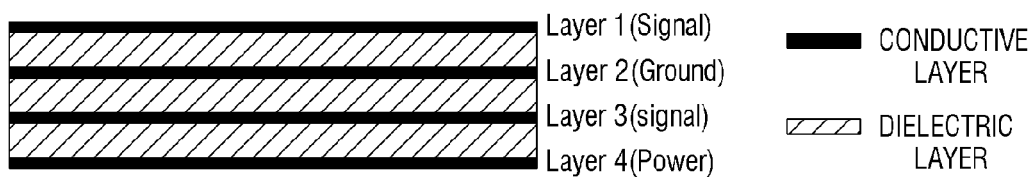

FIGS. 5 and 6 are top views of a board 200 according to an exemplary embodiment of the present disclosure.

With reference to FIGS. 5 and 6, the board 200 includes a plurality of layers. That is, the board 200 is a multi-layer PCB. Specifically, the board 200 may include a plurality of conductive layers that are a plurality of signal layers (e.g., layer 1, 3), power layers (e.g., layer 4), and ground layers (e.g., layer 2), and a dielectric substrate deposited by heat and pressure disposed between each conductive layer.

In addition, each conductive layer may be connected through a punch hole called a via. In a multi-layer PCB the via does not necessarily electrically connect each of all the conductive layers, but may connect only the layers necessary for electrically connecting two or more necessary PCB layers through electrical plating. The via that electrically connects these layers may be differentiated as a through hole via 210 that penetrates the entirety of the PCB layer, a blind via 220 that can be seen only from one surface of the PCB layer, and a buried via 230 that cannot be observed from either of the surfaces of the PCB and is disposed inside the PCB layer.

In addition, the board 200 may include a plurality of terminals (or pads, balls, soldering areas) electrically connected to the plurality of connectors of the chip 300. Specifically, the board 200 may comprise a plurality of terminals 300 for supplying power to the chip 300 and a plurality of terminals for performing communication with the chip 300. Herein, the number of the boards 200 may correspond to the number of the terminals of the chip 300. The plurality of terminals of the board 200 are disposed such that they correspond to the connectors of the chip 300, and thus explanation on a specific disposition format of the terminals of the board 200 is omitted.

Meanwhile, in FIG. 6, it is illustrated that the first layer corresponds to a signal layer, the second layer corresponds to a ground layer, the third layer corresponds to a signal layer, and the fourth layer corresponds to a power layer, but this order may be changed. For example, the first layer and the second layer may be signal layers, and the third layer a power layer, and the fourth layer a ground layer.

When the connectors 400 disposed as illustrated in FIG. 4 are disposed on the board 200, the surface of the board 200 is connected in the same terminal format as the connectors 400. In this case, it is impossible for the board 200 to use only one layer to connect the plurality of connectors 400 and the devices to be connected to each of the plurality of connectors 400.

Specifically, the pattern formed on the circuit board may have a minimum width in order to properly deliver a signal. In this regard, the number of patterns that may be disposed between the terminals to be connected to the connectors of the board 200 is extremely limited. For example, when only one pattern is disposed between two terminals disposed by a predetermined distance, only the two columns (that is, the third signal connectors 440) disposed in an outer-most exterior angle of the plurality of connectors 400 of the chip 300 are patterned through the surface layer (layer 1).

Figure 7:
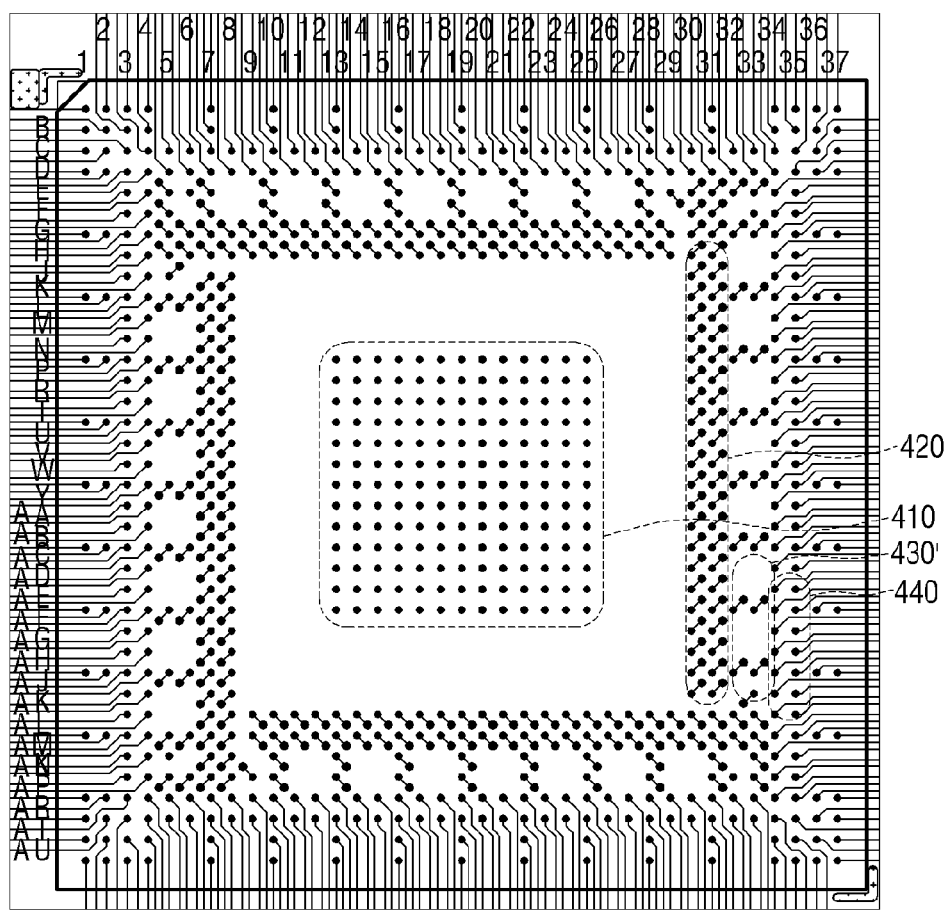
FIG. 7 is a top view of a board at a first layer.
Figure 8:
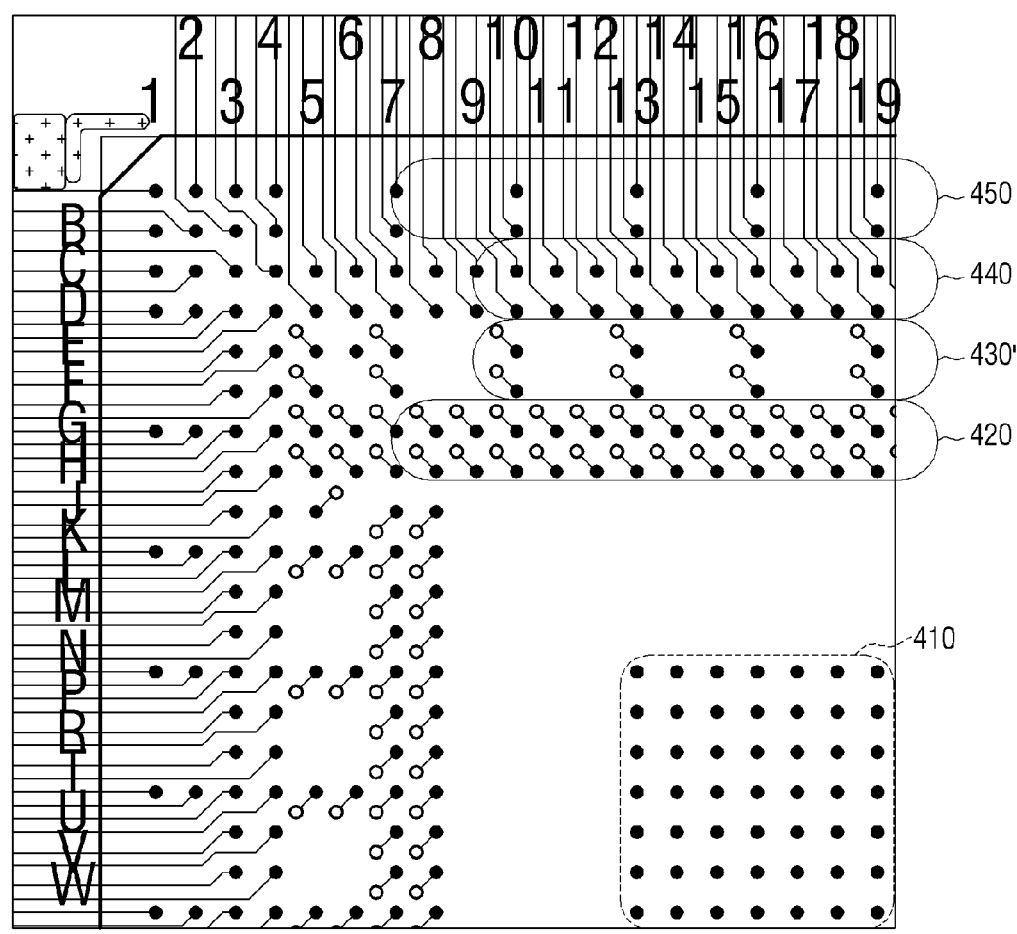
FIG. 8 is an expanded top view of FIG. 6.

Therefore, the connectors 410, 420, 430 besides the two columns disposed in an outer-most angle of the plurality of connectors 400 of the chip 300 (i.e., connectors other than the third signal connectors 440) must be patterned through another layer through the via. FIGS. 7 and 8 illustrate the shape of the first layer of such a board 200.

In this regard, the connectors disposed in the third to fifth columns in the outer-most exterior angle of the plurality of connectors 400 of the chip (that is, the first signal connectors and second signal connectors) are patterned through the buried layer (layer 3) of the board 200. That is, the first signal connector and the second signal connector according to the present exemplary embodiment are connected to the image former 140 through the pattern disposed on the same layer. A more specific shape of the third layer is shown, for example, in FIG. 9.

Meanwhile, the power connector 410 may be patterned through the buried layers 2, 4 of the board 200.

Hereinbelow is an explanation on the format of the first layer and third layer of the board 200 with reference to FIGS. 7 to 9.

FIG. 7 is a top view of the board at the first layer, and FIG. 8 is an exploded view of FIG. 7.

With reference to FIGS. 7 and 8, it can be seen that there are provided on the first layer of the board 200 a plurality of terminals corresponding to the plurality of connectors 400 of the chip 300. For convenience of explanation, the reference numerals and names of the plurality of terminals shall be referred to using the reference numerals and names of the connectors. That is, the configuration of FIGS. 7 to 9 is the configuration of the board 200 and not the chip 300.

The power connector 410 may be located in the center of the chip and may include a plurality of power connectors, in m columns and n lines to have a spacing apart from another corresponding to the predetermined first distance. Such a power connector 410 may be a conventional power connector, and although not illustrated specifically, in each of the plurality of power connectors 410 on the first layer of the board, vias may be adjacently disposed, and each of the plurality of power connectors 410 may be connected to the power layer (layer 4) or ground layer (layer 2) through the vias.

The first signal connectors 420 may be continuously disposed in an exterior direction of the power connectors 410, the first signal connectors 420 spaced apart from one another by the first distance. More specifically, the plurality of first signal connectors 420 are disposed such that they are spaced by the predetermined distance in an exterior direction of the power connectors 410, and each of the first signal connectors 420 may be spaced apart by the first distance from one another.

In addition, in each of the plurality of first signal connectors 420 on the first layer of the board 200, there may be disposed vias to be adjacently connected to the layer 3, which are patterned through the signal layer (layer 3) through the vias.

The second signal connecters 430 may be disposed such that they are spaced apart by two or more times the mutual first distance in an exterior direction of the first signal connectors 420. More specifically, the plurality of second signal connectors 430 may be disposed such that they are spaced apart by the first distance in an exterior angle from the first signal connectors 420, and each of the second signal connecters 430 may be spaced apart by two or more times (e.g., three times in the illustrated exemplary embodiment) of the predetermined first distance from one another.

In addition, in each of the plurality of second signal connectors 430 on the first layer of the board 200, there are disposed vias to be adjacently connected to the layer 3, which are patterned through the signal layer (layer 3) through the vias.

The third signal connectors 440 may be continuously disposed in an exterior direction of the second signal connectors 430 by the first distance. More specifically, the plurality of third signal connectors 440 may be disposed such that they are spaced apart by the first distance in an exterior angle from the second signal connectors 430, and each of the third signal connectors 440 may be mutually spaced apart by the first distance from one another.

The fourth signal connectors 450 may be disposed such that each of them is spaced apart by two or more times the first distance from one another in an exterior angle of the third signal connectors 440. More specifically, the plurality of fourth signal connectors 450 may be disposed such that they are spaced apart by the first distance from the third signal connectors 440 in an exterior angle of the third signal connectors 440, and are disposed such that each of them is mutually spaced apart by two or more times the first predetermined distance (e.g., three times in the illustrated example) from one another.

Herein, the third signal connectors 440 and the fourth signal connectors 450 may be patterned through the signal layer (layer 1) without additional vias.

Figure 9:
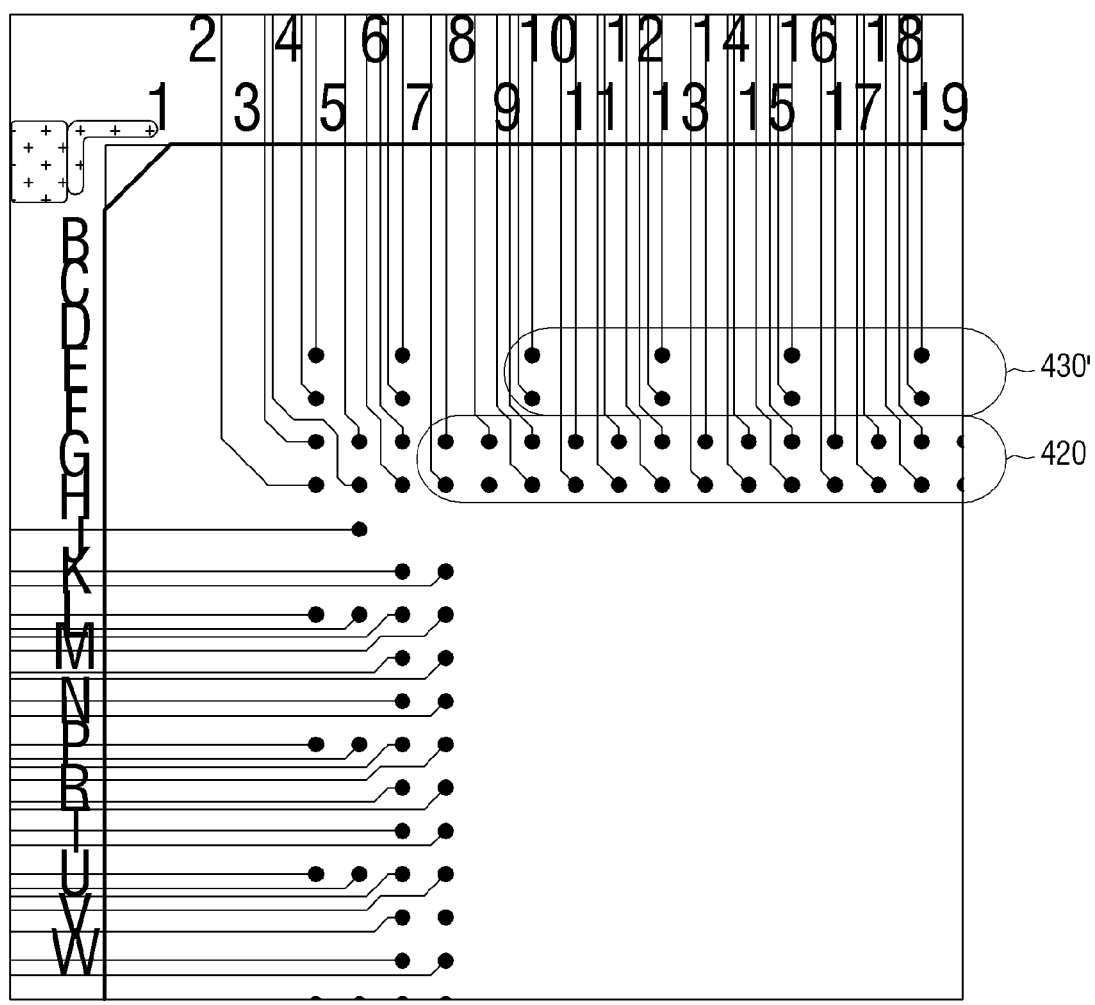
FIG. 9 is a top view of a board at a third layer.

FIG. 9 is a top view of the board at the third layer.

With reference to FIG. 9, on the third layer of the board 200, a pattern regarding the first signal connectors 420 and the second signal connectors 430 are located.

The first signal connectors 420 on the third layer are vias regarding the first signal connectors 420 on the first layer.

The second signal connectors 430 on the third layer are vias regarding the second signal connectors 420 on the first layer. The second signal connectors on the third layer are disposed such that each of them is mutually spaced apart by two or more times the predetermined first distance, and thus the first signal connectors 420 and the second signal connectors 420 are patterned on the same third layer. Therefore, in the case of connecting the same connectors (or terminals), it becomes possible to use a circuit board having a lower layer (i.e., using a less number of layers) than in conventional circuit boards.

Hereinbelow, an explanation on the effects of a ball arrangement method according to the present disclosure is provided, with reference to FIGS. 10 to 14 illustrating the same ball arrangement method as in a conventional ball arrangement.

Figure 10:
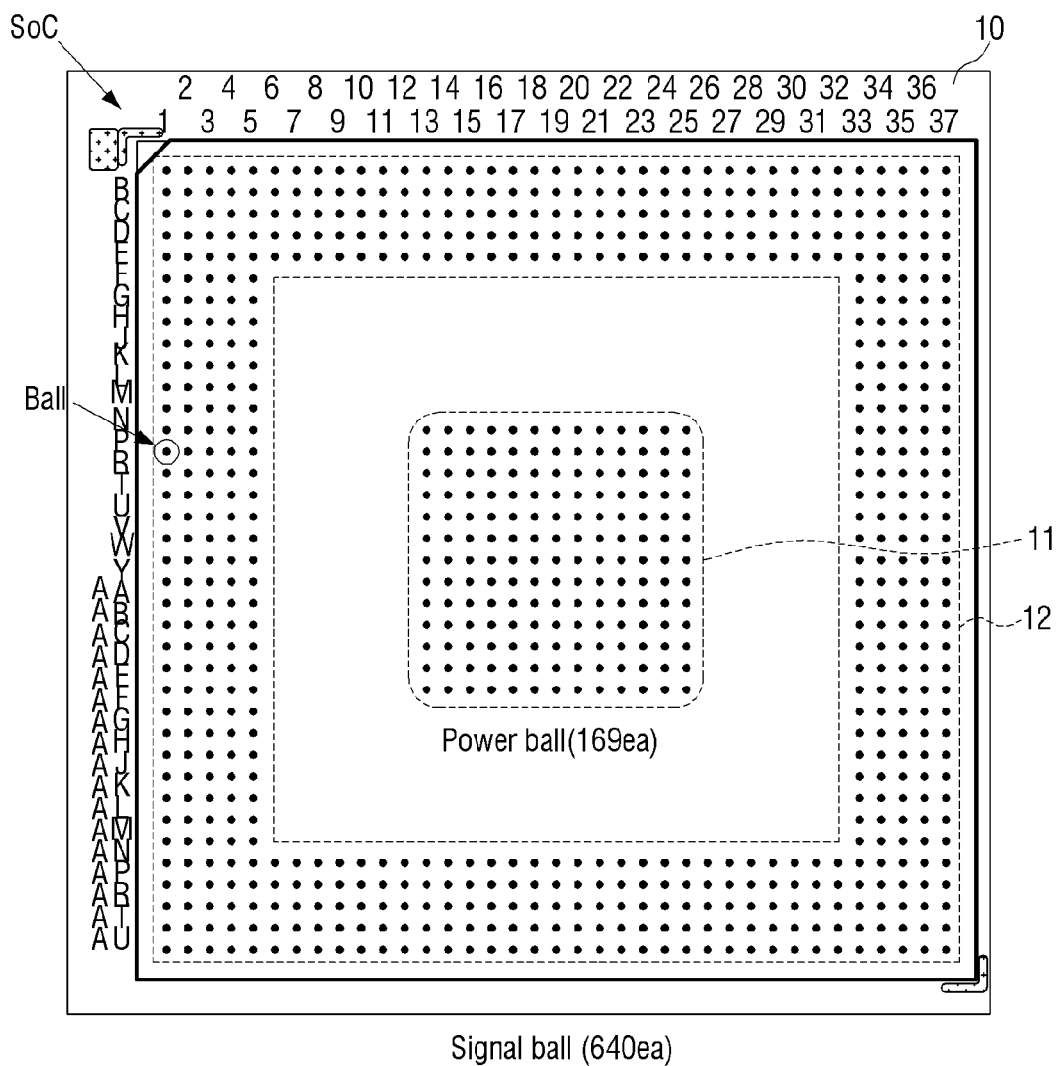
FIGS. 10 to 14 are views illustrating an embodiment of the same number of balls as FIG. 7.

FIG. 10 is a view for illustrating an example where the same number of balls are embodied as in a conventional ball arrangement.

Figure 14:
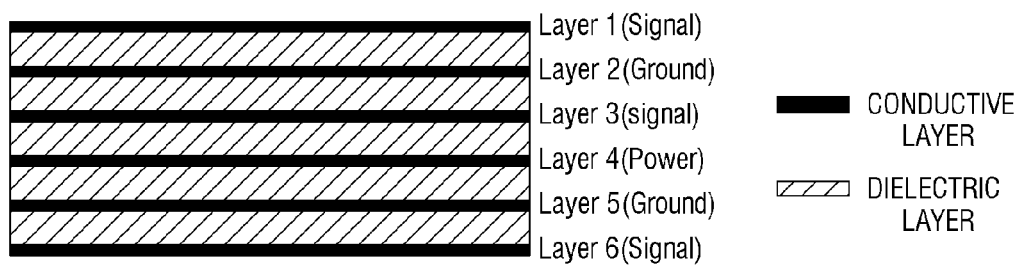

With reference to FIG. 10, balls 11 for power use are disposed in the center of the chip (for example, in a 13 by 13 square arrangement), and 640 balls 12 for delivering signals are disposed surrounding the power balls in a form similar to a concentric square. Each of the signal balls are spaced apart by a certain distance in an exterior direction of the chip 10 in 5 columns. In such a ball arrangement of the chip, for a stable electrical connection with the devices mounted on to the PCB, at least 6 PCB layers having 3 power layers and 3 signal layers are necessary as illustrated in FIG. 14.

Figure 11:
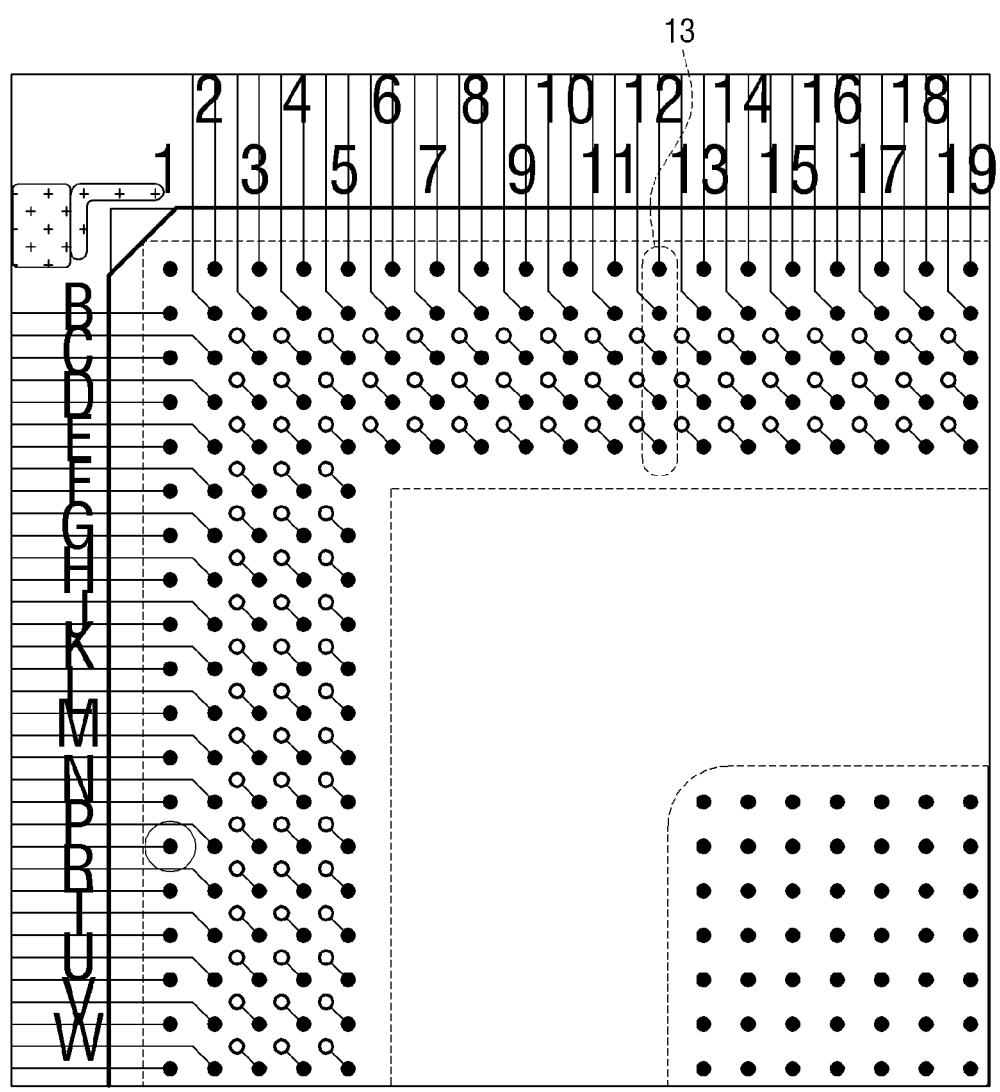

FIG. 11 shows a partial area of layer 1 of the circuit board consisting of 6 layers seen from the top.

With reference to FIG. 11, it can be seen that in order to proceed with a routing for drawing out a pattern for delivering a signal consisting of 5 columns 13, in layer 1, a pattern regarding the first column and second column are drawn out, and the third to fifth columns are connected to other signal layers using vias. Connecting third to fifth columns with other signal layers through vias may be accomplished in a manner similar to the previous discussion with reference to FIG. 4, and thus further explanation is omitted.

Figure 12:
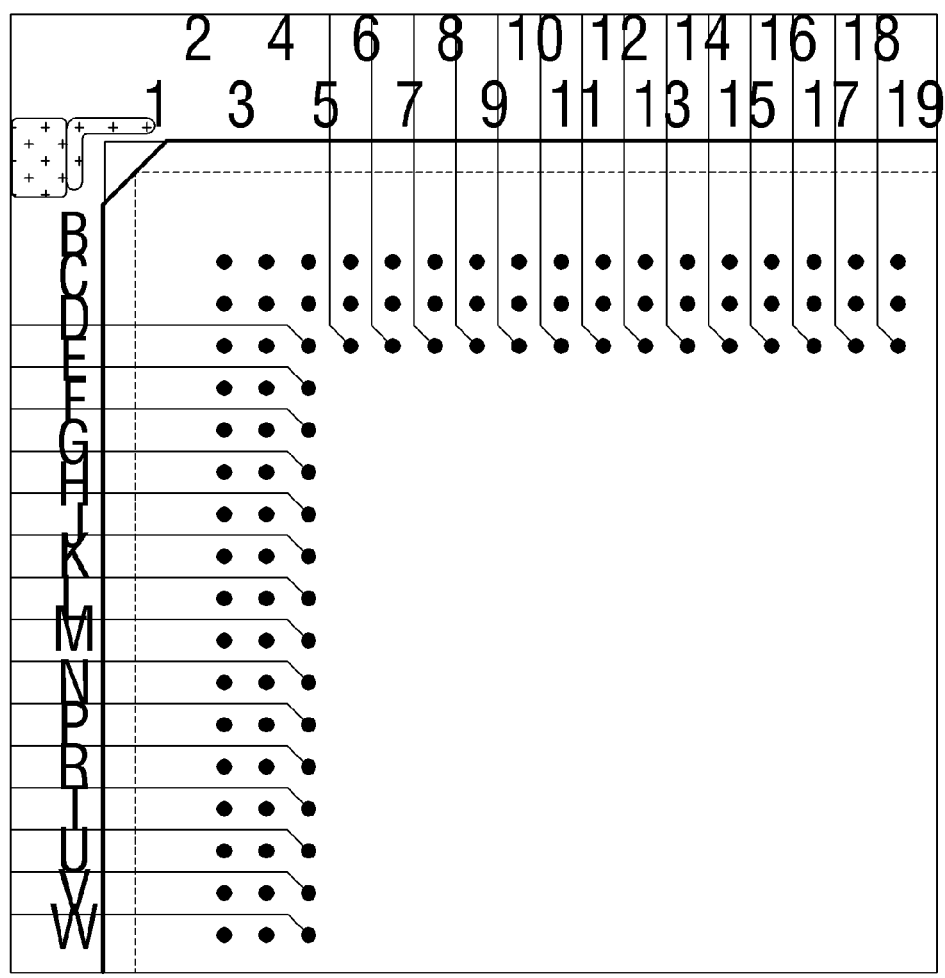

FIG. 12 shows a partial area of layer 3 seen from the top of the circuit board consisting of 6 layers.

With reference to FIG. 12, unlike FIG. 11, there is no ball, but only vias can be seen. Regarding layer 3, it is impossible to proceed with a routing to the same layer 3 with the vias formed by the third and fourth columns, and thus it is possible to proceed with a pattern routing with only the signal vias in one column. That is, as shown in FIG. 12, a single column (here the innermost column), is routed to deliver a signal.

Figure 13:
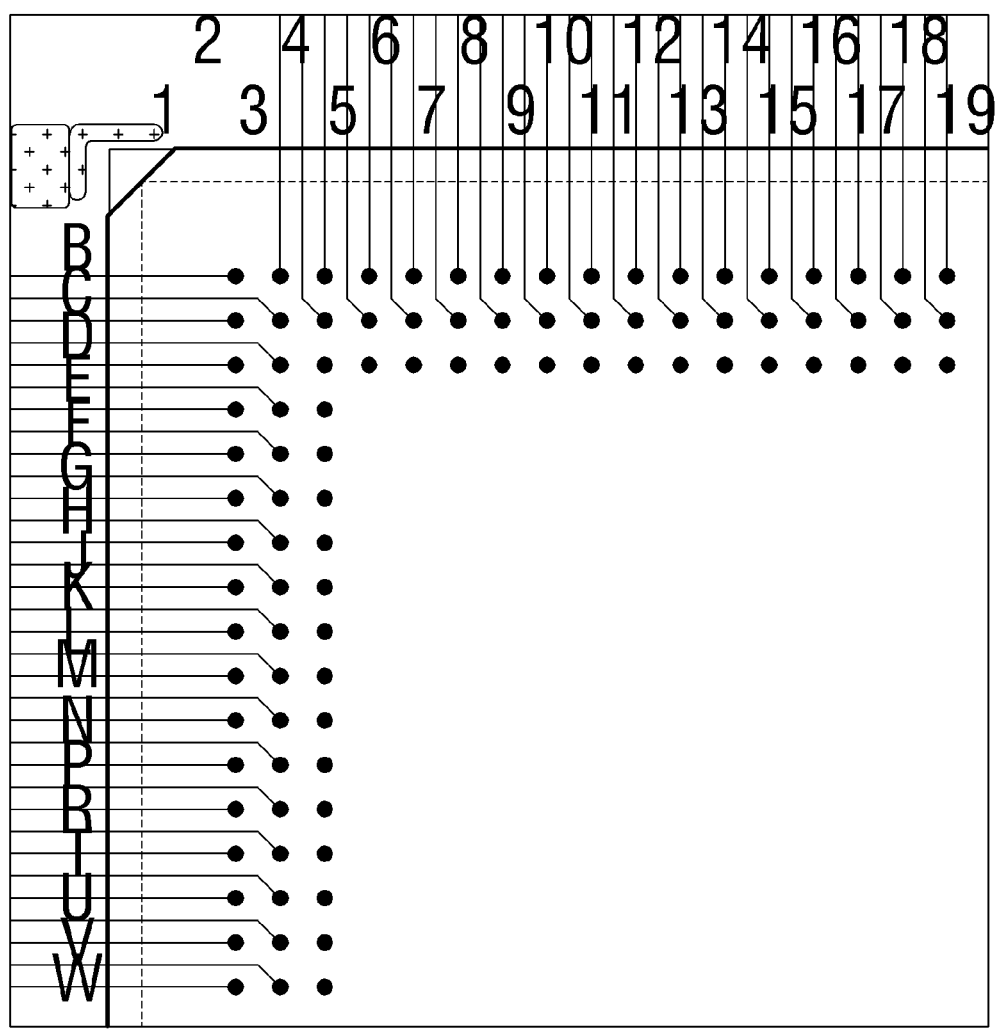

FIG. 13 shows a partial area of layer 6 of the circuit board consisting of 6 layers seen from the top.

With reference to FIG. 13, there is no ball as in FIG. 12, but only vias can be seen. The vias generated by column 3 and column 4 look like column 1 and column 2 seen from layer 6, and thus there is no pattern routing limitation to two columns from the front unlike the vias located in column 3. Therefore, a routing to the same layer 6 is possible. That is, as shown in FIG. 13, two columns (here two columns adjacent to the innermost column of FIG. 12), are routed to deliver signals. Layer 2 and layer 5 not mentioned herein are connected to ground balls, while layer 4 is connected to power balls.

The reason why there is not enough space for drawing out a pattern routing is because there is small space for a pattern routing as illustrated in FIG. 10. It would be better to make more space and perform a pattern routing, but in that case, the size of the SoC would increase, making it difficult to miniaturize the final product and also increasing the manufacturing cost.

Therefore, in the present exemplary embodiment, second signal connectors are used which are disposed such that they are spaced apart by two or more times the predetermined first distance and thus even when using the same number of balls, the size of SoC and the number of PCB layers disposed could be reduced, thereby reducing the cost.

FIGS. 15 to 20 are various top views of a chip according to another exemplary embodiment of the present disclosure.

Figure 15:
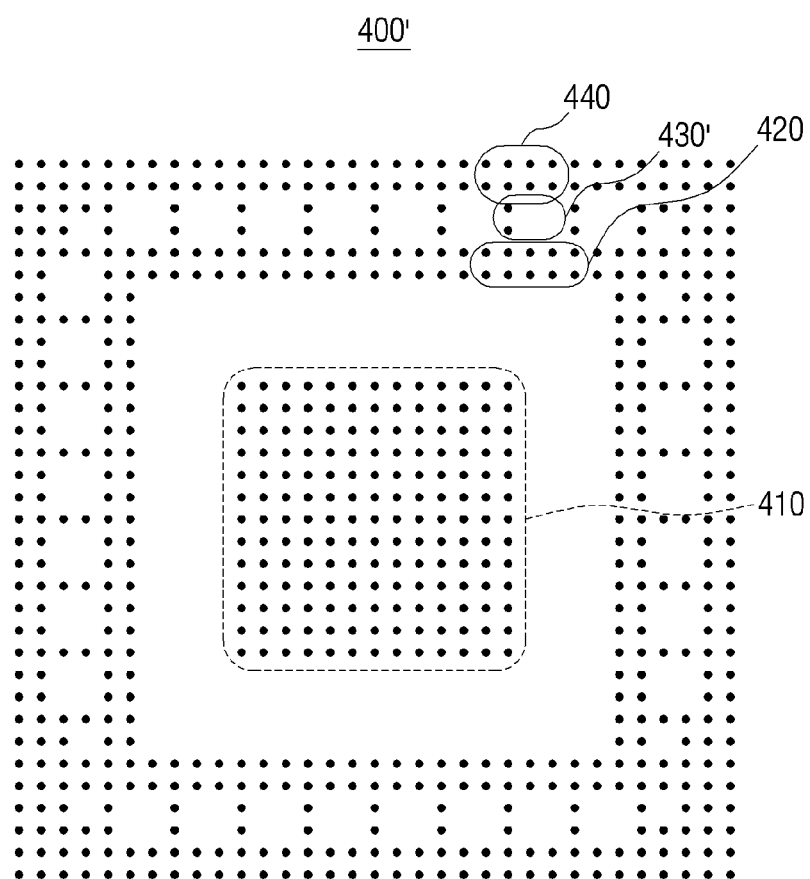
FIGS. 15 to 20 are various top views of a chip according to another exemplary embodiment of the present disclosure.

FIG. 15 is a top view of a chip according to another exemplary embodiment of the present disclosure. More specifically, when compared to the exemplary embodiment of FIG. 4, the exemplary embodiment of FIG. 15 is an example of a case where the second signal connectors 430' are embodied in two columns, rather than a single column.

More specifically, the plurality of connectors 400' of a chip according to the exemplary embodiment include power connectors 410, first signal connectors 420, second signal connectors 430', and third signal connectors 440.

The power connectors 410, first signal connectors 420, and third signal connectors 440 are explained hereinabove with reference to FIG. 4, and thus an explanation or further detail thereof is omitted.

The second signal connectors 430' may have a plurality of columns continuously disposed by the predetermined first distance. In this case, there is no limitation to the number of columns of the second signal connectors 430', but the larger the size area that the second signal connectors 430' occupy, the less number of other signal connectors may be disposed in the chip, and thus it is desirable that the second signal connectors 430' do not have many columns.

Figure 16:
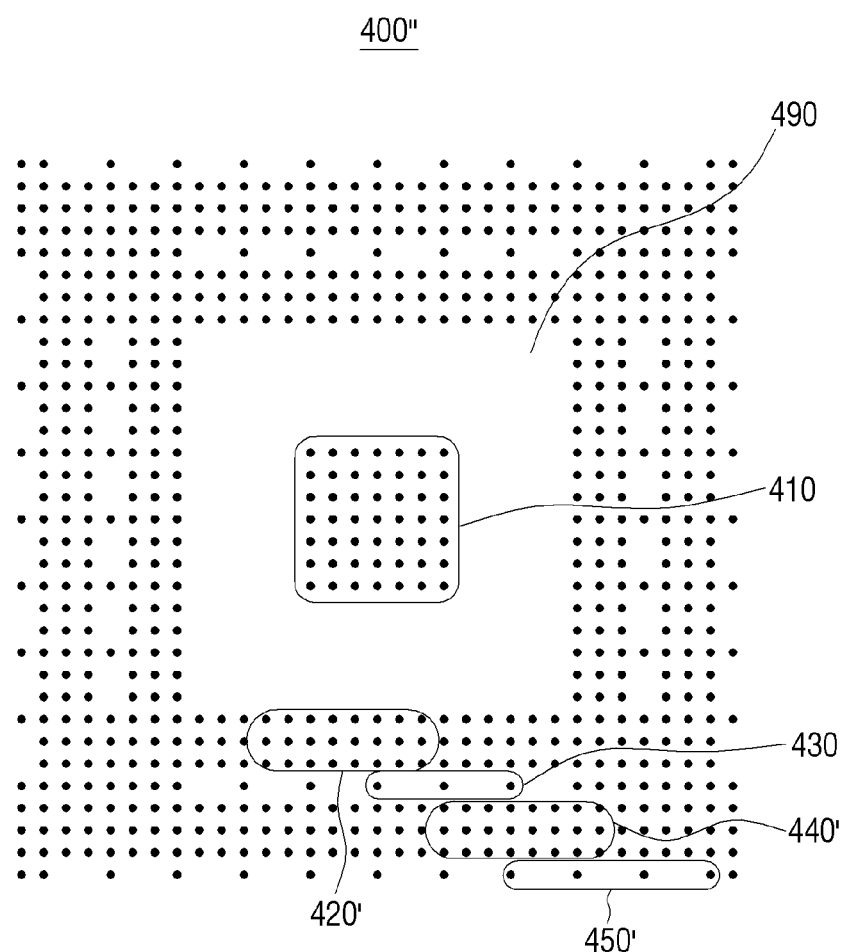

FIG. 16 shows a top view of a chip according to an exemplary embodiment. More specifically, when compared with the exemplary embodiment of FIG. 4, the third exemplary embodiment illustrates an example of a case where fourth signal connectors 450' are additionally provided.

More specifically, the plurality of connectors 400" of the chip according to the exemplary embodiment include power connectors 410, first signal connectors 420', second signal connectors 430, third signal connectors 440', and fourth signal connectors 450'. FIG. 16 shows an example of a case where the first signal connectors 420' and third signal connectors 440' are embodied in three columns, rather than two columns.

The power connectors 410, first signal connectors 420', second signal connectors 430, and third signal connectors 440' are otherwise similar to FIG. 4, and thus a more detailed explanation thereof is omitted.

The fourth signal connectors 450' may be disposed such that each of them is mutually spaced apart by two or more times the first distance in an exterior angle of the third signal connectors 440'. More specifically, the plurality of fourth signal connectors 450' are disposed such that they are spaced apart by the first distance in an exterior angle from the third signal connectors 440', and that each of them is mutually spaced apart by two or more times (e.g., three times in the illustrated exemplary embodiment) the predetermined first distance from one another.

Figure 17:
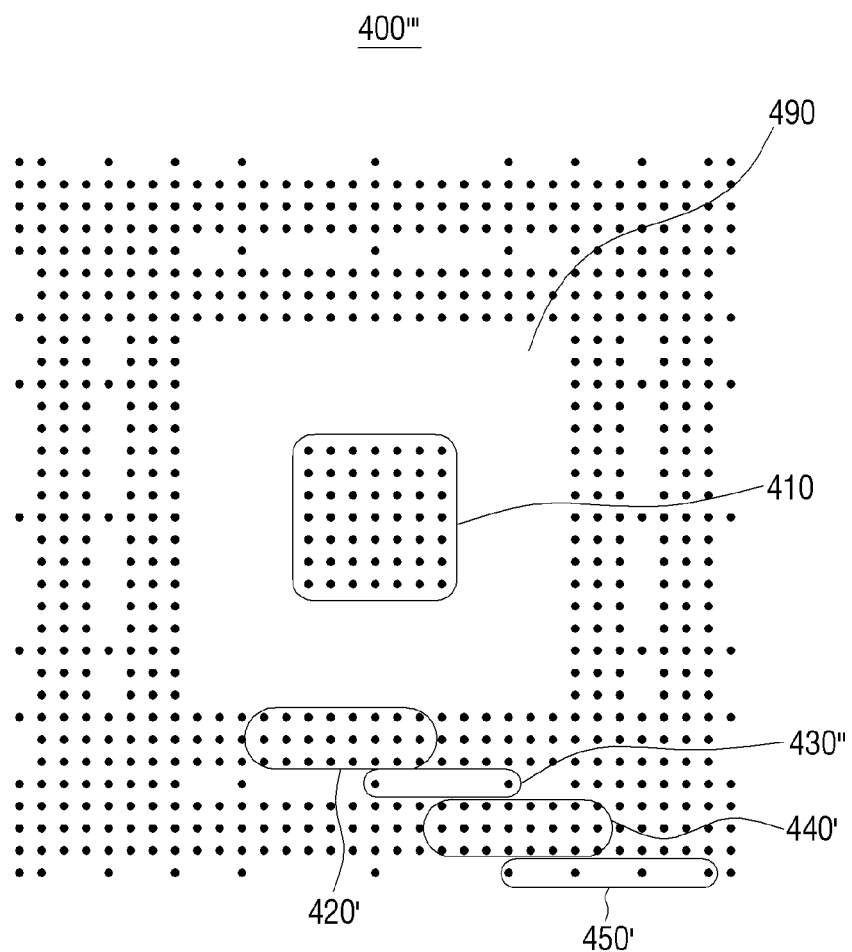

FIG. 17 shows a top view of a chip according to an exemplary embodiment of the present disclosure. More specifically, when compared with the exemplary embodiment of FIG. 16, the exemplary embodiment of FIG. 17 shows an example of a case where the second signal connectors 430" have a different mutual distance apart from one another than compared to the second signal connectors 430 of FIG. 16.

More specifically, the plurality of connectors 400''' of the chip according to the exemplary embodiment include power connectors 410, first signal connectors 420', second signal connectors 430", third signal connectors 440', and fourth signal connectors 450'.

The power connectors 410, first signal connectors 420', third signal connectors 440', and fourth signal connectors 450' are the same as in FIG. 16, and thus a repeated explanation thereof is omitted.

The second signal connectors 430" are disposed such that each of them is mutually spaced apart by two or more times the first distance from one another in an exterior angle of the first signal connectors 420'. More specifically, the plurality of second signal connectors 430" are disposed such that they are spaced apart by the first distance in an exterior angle from the first signal connectors 420', and that each of them is mutually spaced apart by two or more times the predetermined first distance from one another (e.g., six times in the illustrated example).

Figure 18:
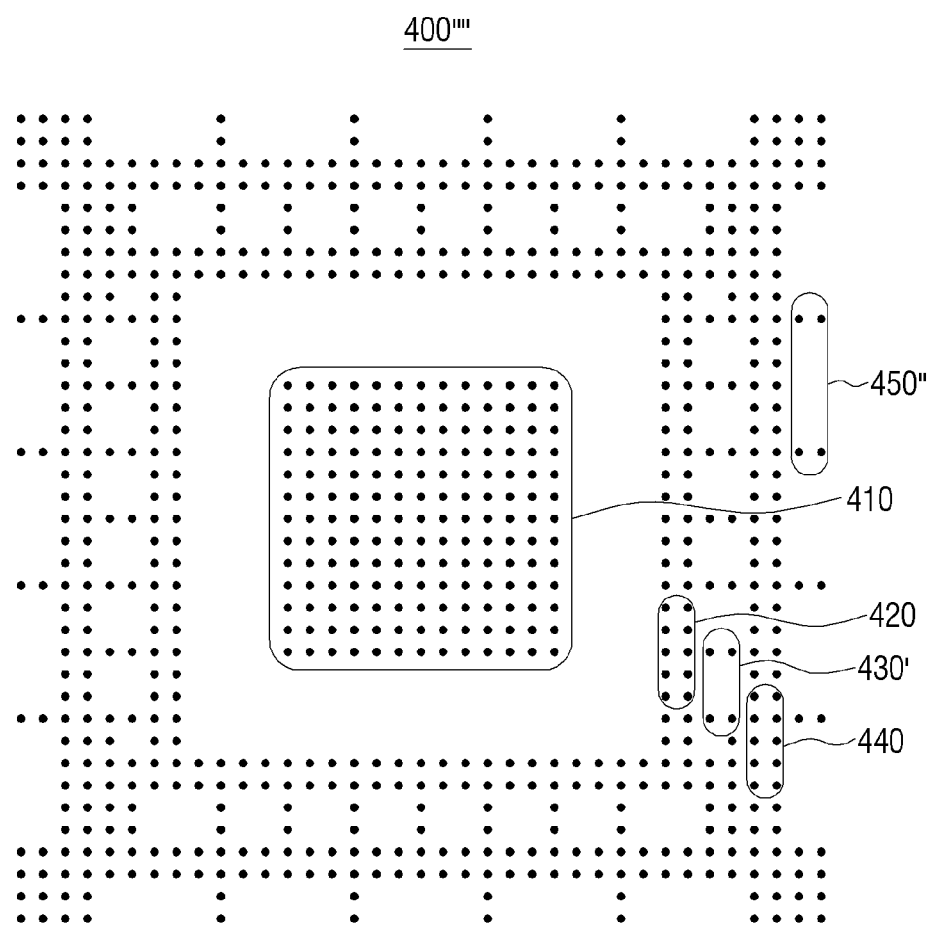

FIG. 18 is a top view of a chip according to an exemplary embodiment. More specifically, when compared to the exemplary embodiment of FIG. 16, the exemplary embodiment of FIG. 18 shows an example of a case where the second signal connectors 430' and fourth signal connectors 450" are embodied in two columns. In contrast, FIG. 16 shows an example of case where the second signal connectors 430 and fourth signal connectors 450' are embodied in one column. Further, it can be seen that each of the fourth signal connectors 450" of FIG. 18 are spaced apart from one another by a different mutual distance than in FIG. 16 (e.g., six times in FIG. 18, while three times in FIG. 16.)

More specifically, the plurality of connectors 400"" of the chip according to the exemplary embodiment include power connectors 410, first signal connectors 420, second signal connectors 430', third signal connectors 440, and fourth signal connectors 450".

The power connectors 410, first signal connectors 420, and third signal connectors 440 are explained hereinabove with reference to FIG. 4, and thus a further explanation thereof is omitted.

The second signal connectors 430' may have a plurality of columns continuously disposed by the predetermined first distance. In this case, there is no limitation to the number of columns of the second signal connectors 430', but the larger the size area that the second signal connectors 430' occupy, the less number of other signal connectors may be disposed in the chip, and thus it is desirable that the second signal connectors 430' do not have many columns.

The fourth signal connectors 450" may have a plurality of columns continuously disposed by the predetermined first distance. The fourth signal connectors 450" may be disposed such that each of them is mutually spaced apart by two or more times the first distance in an exterior angle of the third signal connectors 440. More specifically, the plurality of fourth signal connectors 450" may be disposed such that they are spaced apart by the first distance in an exterior angle from the third signal connectors 440, and that each of them is mutually spaced apart by two or more times (e.g., six times in the illustrated exemplary embodiment) the predetermined first distance from one another.

Figure 19:
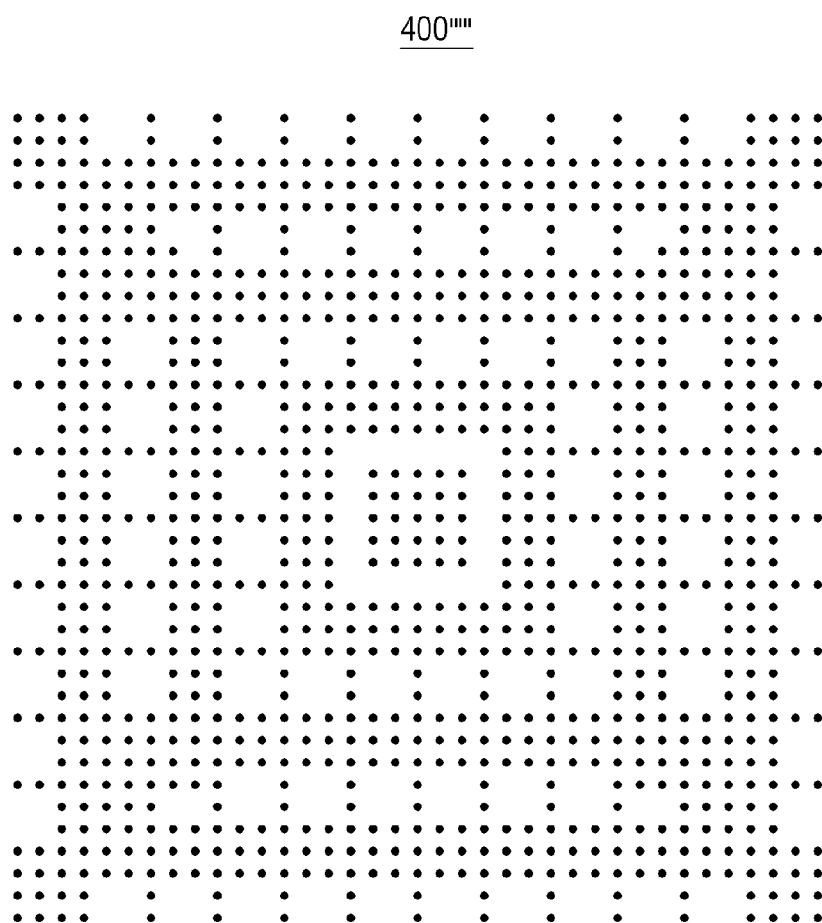
Figure 20:
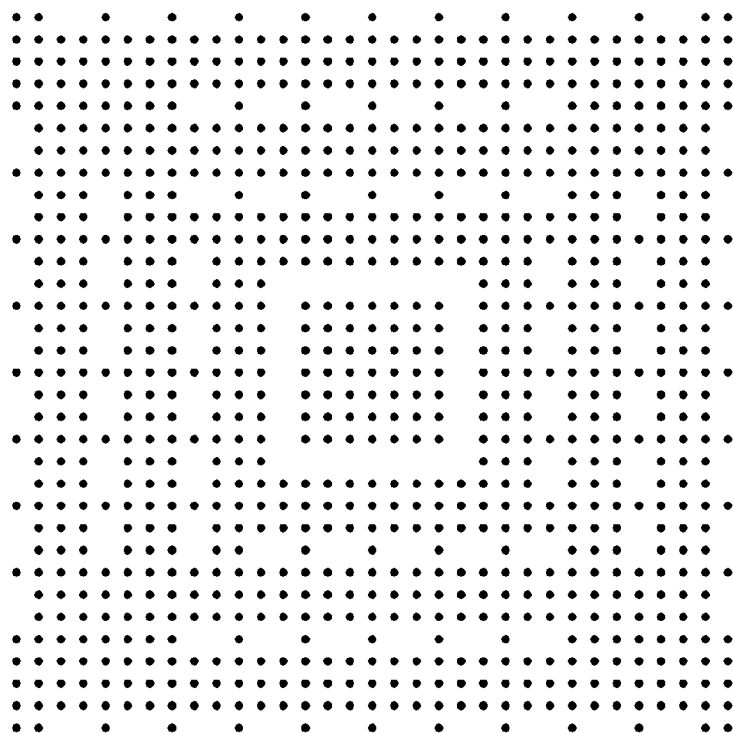

FIGS. 19 and 20 are top views of a chip according to additional exemplary embodiments. With reference to FIGS. 19 and 20, the sixth and seventh exemplary embodiments are cases where fifth signal connectors and sixth signal connectors have been additionally added to the exemplary embodiments of FIGS. 16 and 17. That is, as can be seen from FIG. 19, from the innermost columns to the outermost columns of the signal connectors, the first to tenth columns are arranged similarly to the first to fourth signal connectors as shown in FIG. 16. As can be seen from FIG. 20, from the innermost columns to the outermost columns of the signal connectors, the first to tenth columns are arranged similarly to the first to fourth signal connectors as shown in FIG. 17.

The fifth signal connectors may be spaced apart from one another by the first distance. More specifically, the plurality of fifth signal connectors may be disposed such that they are spaced apart by the predetermined distance in an exterior direction of the fourth signal connectors, and each of the fifth signal connectors may be spaced apart by the first distance from one another. As shown in FIGS. 19 and 20, the fifth signal connectors may include three columns, similar to the first and third signal connectors.

The sixth signal connectors may be disposed such that they are spaced apart by two or more times the mutual first distance in an exterior direction of the fifth signal connectors. More specifically, the plurality of sixth signal connectors may be disposed such that they are spaced apart by the first distance in an exterior angle from the fifth signal connectors, and each of the sixth signal connecters may be spaced apart by two or more times the predetermined first distance from one another (e.g., three times in the embodiment of FIGS. 19 and 20). As shown in FIGS. 19 and 20, the fifth signal connectors may include a single column, or a plurality of columns (e.g., two columns in FIG. 19).

In accordance with the disclosure herein, a size of an SoC and the number of necessary PCB layers may be reduced by providing a chip with a ball arrangement according to the above-described example embodiments. Thus, the cost of manufacturing such devices may be reduced, while obtaining the same functionality.

Although example embodiments of the present invention have been shown and described, it would be appreciated by those skilled in the art that changes may be made to the example embodiments disclosed herein without departing from the principles and spirit of the invention, the scope of which is defined in the claims and their equivalents.

What is claimed is:

1. An image forming apparatus, comprising:
a board to control an image forming job processor; and
an image former to perform an image forming job according to a control by the board, wherein the board comprises a chip including:
a plurality of power connectors to provide power,
a plurality of first signal connectors continuously disposed in an exterior angle of the power connectors, the plurality of first signal connectors being spaced apart from one another by a first distance,
a plurality of second signal connectors disposed in an exterior angle of the first signal connectors, the plurality of second signal connectors including a first second signal connector, a second second signal connector, and a third second signal connector being repeatedly arranged in a same column, the second second signal connector being a nearest second signal connector in the same column to each of the first second signal connector and the third second signal connector, and being spaced apart from each of the first second signal connector and the third second signal connectors by two or more times the first distance, and
a plurality of third signal connectors continuously disposed in an exterior angle of the second signal connectors, the plurality of third signal connectors being spaced apart from one another by the first distance;
wherein the board comprises a plurality of layers,
the plurality of first signal connectors and the plurality of second signal connectors are disposed in a same first layer of the board, and
the board is connected to the image former.

2. The image forming apparatus according to claim 1, wherein the board comprises a plurality of vias to connect the plurality of first signal connectors and the plurality of second signal connectors.

3. The image forming apparatus according to claim 1, wherein the plurality of first signal connectors are arranged in a plurality of columns, continuously disposed in the exterior angle of the power connectors and spaced apart from one another by the first distance.

4. The image forming apparatus according to claim 1, wherein the plurality of second signal connectors are disposed in a line direction each spaced apart by two or more times the first distance, and are continuously disposed in a column direction in a plurality of columns each spaced apart by the first distance.

5. The image forming apparatus according to claim 1, wherein the plurality of third signal connectors are disposed in a plurality of columns continuously disposed in an exterior angle of the second signal connectors and spaced apart from one another by the first distance.

6. The image forming apparatus according to claim 1, wherein the plurality of third signal connectors are disposed on a surface of the board, and the board is connected to the image former.

7. The image forming apparatus according to claim 1, wherein the plurality of power connectors are disposed in m columns and n lines (m and n being natural numbers) each spaced apart from one another by the first distance.

8. The image forming apparatus according to claim 1 wherein the plurality of power connectors and the plurality of first signal connectors are spaced apart by a second distance from each other.

9. The image forming apparatus according to claim 3, wherein the number of the columns of the plurality of first signal connectors is one more than the number of patterns that may be disposed between the first distance.

10. An image forming apparatus, comprising:
a board to control an image forming job processor; and
an image former to perform an image forming job according to a control by the board,
wherein the board comprises a chip including:
 a plurality of power connectors to provide power,
 a plurality of first signal connectors continuously disposed in an exterior angle of the power connectors, the plurality of first signal connectors being spaced apart from one another by a first distance,
 a plurality of second signal connectors disposed in an exterior angle of the first signal connectors, the plurality of second signal connectors being spaced apart from one another by two or more times the first distance,
 a plurality of third signal connectors continuously disposed in an exterior angle of the second signal connectors, the plurality of third signal connectors being spaced apart from one another by the first distance, and
 a plurality of fourth signal connectors disposed in an exterior angle of the third signal connectors, the plurality of fourth signal connectors being spaced apart from one another by two or more times the first distance.

11. The image forming apparatus according to claim 10, wherein the board comprises a plurality of layers,
the plurality of third signal connectors and the plurality of fourth signal connectors are disposed in a same layer of the board, and
the board is connected to the image former.

12. A chip for an image forming apparatus, the chip comprising:
 a control logic unit;
 a board electrically connected to the control logic unit;
 a plurality of power connectors to supply power to the control logic unit; and a plurality of signal connectors to transceiver signals between the control logic unit and an external multi-layer circuit board, wherein the plurality of signal connectors comprises:
 a plurality of first signal connectors disposed in an exterior angle of the power connectors, the plurality of first signal connectors being spaced apart from one another by a first distance;
 a plurality of second signal connectors disposed in an exterior angle of the first signal connectors, at least three of the plurality of second signal connectors being repeatedly arranged in a same column, and each of the at least three of the plurality of second signal connectors being spaced apart from at least one other of the at least of the plurality of second connectors by two or more times the first distance; and
 a plurality of third signal connectors disposed in an exterior angle of the second signal connectors, the plurality of third signal connectors being spaced apart from one another by the first distance;
wherein
the external multi-layer circuit board comprises a plurality of layers,
the plurality of second signal connectors are patterned through to a layer among the plurality of layers of the external multi-layer circuit board,
the plurality of third signal connectors are patterned through to another layer among the plurality of layers of the external multi-layer circuit board, and
the external multi-layer circuit board is connected to an image former of the image forming apparatus.

13. The chip according to claim 12,
wherein the plurality of first signal connectors are disposed in a plurality of columns, continuously disposed in the exterior angle of the power connectors and spaced apart from one another by the first distance.

14. The chip according to claim 12,
wherein the plurality of second signal connectors are disposed in a line direction each spaced apart by two or more times the first distance, and are continuously disposed in a column direction in a plurality of columns each spaced apart by the first distance.

15. The chip according to claim 12, wherein the plurality of third signal connectors are disposed in a plurality of columns, continuously disposed in an exterior angle of the second signal connectors and spaced apart from one another by the first distance.

16. The chip according to claim 12,
wherein the plurality of power connectors are disposed in m columns and n lines (m and n being natural numbers) each spaced apart from one another by the first distance.

17. The chip according to claim 12,
wherein the plurality of power connectors and the plurality of first signal connectors are spaced apart by a second distance from each other.

18. The chip according to claim 12, wherein the chip further comprises a plurality of fourth signal connectors disposed in an exterior angle of the third signal connectors, the plurality of fourth signal connectors being spaced apart from one another by two or more times the first distance.

19. The chip according to claim 13,
wherein the number of the columns of the plurality of first signal connectors is one more than the number of patterns that may be disposed between the first distance.

* * * * *